(12) United States Patent
Jung et al.

(10) Patent No.: US 8,093,603 B2
(45) Date of Patent: Jan. 10, 2012

(54) ORGANIC LIGHT EMITTING DIODE DISPLAY

(75) Inventors: Woo-Suk Jung, Gyunggi-do (KR);
Soon-Ryong Park, Gyunggi-do (KR);
Hee-Seong Jeong, Gyunggi-do (KR);
Chul-Woo Jeong, Gyunggi-do (KR);
Hee-Chul Jeon, Gyunggi-do (KR);
Eun-Ah Kim, Gyunggi-do (KR);
Noh-Min Kwak, Gyunggi-do (KR);
Joo-Hwa Lee, Gyunggi-do (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 55 days.

(21) Appl. No.: 12/630,917

(22) Filed: Dec. 4, 2009

(65) Prior Publication Data

US 2010/0148192 A1    Jun. 17, 2010

(30) Foreign Application Priority Data

Dec. 11, 2008  (KR) ........................ 10-2008-0126039

(51) Int. Cl.
*H01L 33/00* (2010.01)
*H01J 1/62* (2006.01)

(52) U.S. Cl. ............... 257/88; 257/57; 257/59; 257/72; 257/79; 257/89; 257/E25.032; 257/E27.111; 257/E33.06; 313/506; 313/512; 315/169.3; 315/501; 315/506; 345/76; 345/82

(58) Field of Classification Search ................... 257/57, 257/59, 72, 79, 88, 89, E25.032, E27.111, 257/E33.06; 313/506, 512; 315/169.3, 501, 315/506; 345/76, 82
See application file for complete search history.

(56) References Cited

U.S. PATENT DOCUMENTS

| 6,528,951 | B2* | 3/2003 | Yamazaki et al. | 315/169.3 |
| 7,515,125 | B2* | 4/2009 | Yamazaki et al. | 345/76 |
| 7,839,081 | B2* | 11/2010 | Kubota et al. | 313/506 |
| 2009/0026946 | A1* | 1/2009 | Satake | 313/512 |

FOREIGN PATENT DOCUMENTS

KR    10-0623225    9/2006
* cited by examiner

*Primary Examiner* — Dao H Nguyen
(74) *Attorney, Agent, or Firm* — Christie, Parker & Hale, LLP

(57) ABSTRACT

An organic light emitting diode display includes a substrate, a pixel electrode, a pixel defining film, a light absorbing layer pattern, an organic light emitting layer and a common electrode. The pixel electrode is formed on the substrate, and the pixel defining film formed on the substrate has an opening to expose the pixel electrode. The light absorbing member divides the opening into a plurality of sub-emitting areas within the opening of the pixel defining film. The organic light emitting layer is formed on the pixel electrode, and the common electrode is formed on the organic light emitting layer.

27 Claims, 11 Drawing Sheets

ORGANIC LIGHT EMITTING DIODE DISPLAY

CROSS-REFERENCE TO RELATED APPLICATION

This application claims priority to and the benefit of Korean Patent Application No. 10-2008-0126039 filed in the Korean Intellectual Property Office on Dec. 11, 2008, the entire contents of which are incorporated herein by reference.

BACKGROUND OF THE INVENTION

1. Field of the Invention

An aspect of the present invention relates to an organic light emitting diode display, and more particularly, to an organic light emitting diode display having improved visibility.

2. Description of the Related Art

An organic light emitting diode (OLED) display includes a plurality of light emitting diodes each having a hole injection electrode, an organic emission layer, and an electron injection electrode. An exciton is formed by combining holes and electrons inside the organic light emitting layer, and light is emitted by energy generated when the excitons fall from an excited state to a ground state, whereby the organic light emitting diode display forms an image.

Accordingly, an organic light emitting diode display is self-emissive, and can be reduced in thickness and weight because a separate light source is not required. The organic light emitting diode display, furthermore, has high quality characteristics such as low power consumption, high-luminance, and rapid response time. Due to such high-quality characteristics, the OLED has drawn attention as a next generation display device for a portable electronic device.

Generally, one or more of the hole injection electrodes and the electron injection electrodes and various other metal wires of the organic light emitting diode display reflect external light. Due to such external light reflection, the organic light emitting diode display has a problem in that visibility deteriorates because of poor black representation and contrast.

The above information disclosed in this Background section is only for enhancement of understanding of the background of the invention and therefore it may contain information that does not form the prior art that is already known in this country to a person of ordinary skill in the art.

SUMMARY OF THE INVENTION

Accordingly, aspects of the present invention have been made to address the above-mentioned and/or or other problems occurring in the related art, and an aspect of the present invention is to provide an organic light emitting diode display having improved visibility.

An organic light emitting diode display according to an exemplary embodiment of the present invention includes: a substrate member; a pixel electrode formed on the substrate member; a pixel defining film having an opening through which the pixel electrode is exposed, and formed on the substrate member; a light absorbing layer pattern for dividing the opening into a plurality of sub-emitting areas within the opening of the pixel defining film; an organic light emitting layer formed on the pixel electrode; and a common electrode formed on the organic light emitting layer.

According to another aspect of the present invention, the light absorbing layer pattern may be formed between the pixel electrode and the organic light emitting layer.

According to another aspect of the present invention, the organic emission layer may generate light on the plurality of sub-emitting areas divided by the light absorbing layer pattern.

According to another aspect of the present invention, the light absorbing layer pattern may be formed horizontally in a longitudinal direction of the opening of the pixel defining film.

According to another aspect of the present invention, the light absorbing layer pattern may have a width of $1/100$ to $1/20$ with respect to the length of the opening of the pixel defining film.

According to another aspect of the present invention, two or more light absorbing layer patterns may be formed for one opening of the pixel defining film.

According to another aspect of the present invention, the light absorbing layer pattern and the pixel defining film may have a black base color.

According to another aspect of the present invention, the light absorbing layer pattern may be formed on the same layer as the pixel defining film through the same process.

According to another aspect of the present invention, the organic light emitting diode display may further include a sealing member that has a light shielding film pattern formed on a surface facing the common electrode, and is formed on the common electrode.

According to another aspect of the present invention, the light shielding film pattern may be formed in a stripe pattern parallel to the light absorbing layer pattern.

According to another aspect of the present invention, the light shielding film pattern may be formed in a lattice pattern.

According to another aspect of the present invention, the light shielding film pattern may have a width of about several micrometers (μm).

According to another aspect of the present invention, the organic light emitting diode display may further include a transmissive film formed on the common electrode and an additional common electrode formed on the transmissive film.

According to another aspect of the present invention, the common electrode and the additional common electrode may be formed of a semi-transmissive film.

According to another aspect of the present invention, the common electrode and the additional common electrode may be made of one or more metals among magnesium (Mg), silver (Ag), calcium (Ca), lithium (Li), chromium (Cr), and aluminum (Al).

According to another aspect of the present invention, the common electrode may be formed of a double film including a first metal film and a second metal film, and the first metal film may include silver (Ag) and the second metal film includes any one metal among a magnesium-silver alloy (Mg: Ag), aluminum (Al), calcium (Ca), lithium (Li), and chromium (Cr).

According to another aspect of the present invention, the organic light emitting diode display may further include a plurality of light scattering spacers protruded on the pixel defining film.

According to another aspect of the present invention, the shape of the light scattering spacers may include one or more of a prismoid, a prism, a cone, a cylinder, a hemisphere, and a semi-spheroid.

According to another aspect of the present invention, the organic light emitting diode display may further include a sealing member disposed facing the substrate member with the light scattering spacers interposed therebetween, and the light scattering spacers may maintain the gap between the substrate member and the sealing member.

According to another aspect of the present invention, the light scattering spacers may be integrally formed on the pixel defining film by the same process and using the same material.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
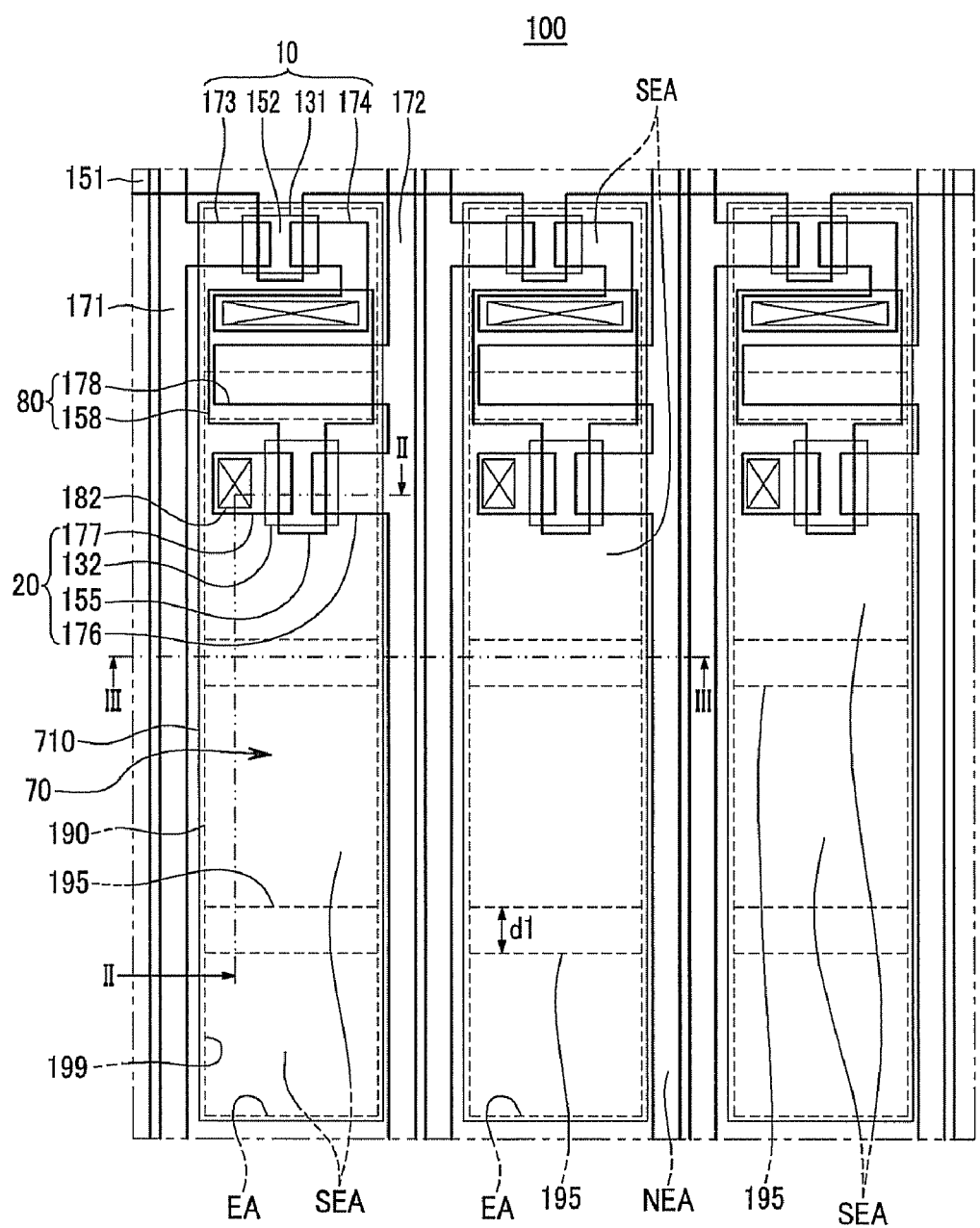
FIG. 1 is a layout view of an organic light emitting diode display according to a first exemplary embodiment of the present invention.

Hereinafter, various exemplary embodiments of the present invention will be described in detail with reference to the attached drawings so that those skilled in the art can easily put the invention into practice. However, the aspects of the present invention may be implemented in several different forms and is not limited to the embodiments described herein.

Also, in describing various exemplary embodiments of the present invention, elements which have the same composition between the exemplary embodiments are referred to by using the same numerals and described representatively in a first exemplary embodiment of the present invention. In the remaining exemplary embodiments other than the first exemplary embodiment, only elements that are different from those in the first exemplary embodiment are described.

For clarity, parts not related to the illustration will be omitted, and the same reference numbers will be denoted for the same or similar elements throughout the specification.

In addition, the sizes and thicknesses of the elements shown in the drawings are arbitrarily drawn for facilitating the reading of the drawings, and are not intended to be limitations.

In the drawings, the thickness of layers and regions are exaggerated for clarity. In the drawings, the thickness of some of the layers and regions are exaggerated for the convenience of explanation. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, the accompanying drawings show an active matrix (AM)-type OLED having a 2Tr-1Cap structure in which one pixel may include two thin film transistors (TFTs) and one capacitor, but it is not limited thereto. Accordingly, the organic light emitting diode display can have three or more thin film transistors and two or more capacitors in one pixel, and may have various structures including separate wires. Herein, the pixel is a minimum unit used to display an image. The organic light emitting diode display displays an image through a plurality of pixels.

Hereinafter, a first embodiment of the present invention will be described with reference to FIGS. 1 to 3.

Figure 2:
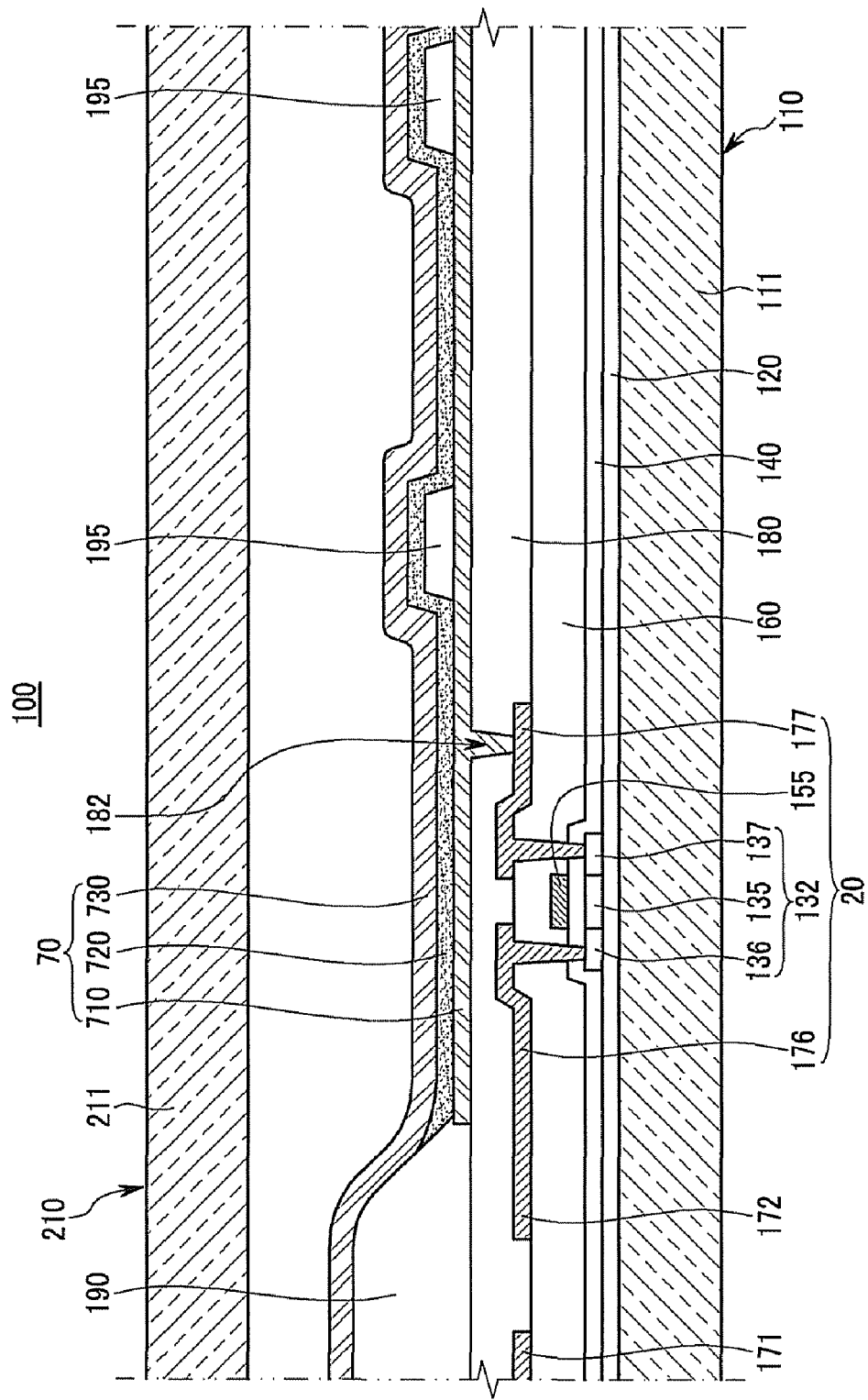
FIG. 2 is a cross-sectional view taken along line II-II of FIG. 1.
Figure 3:
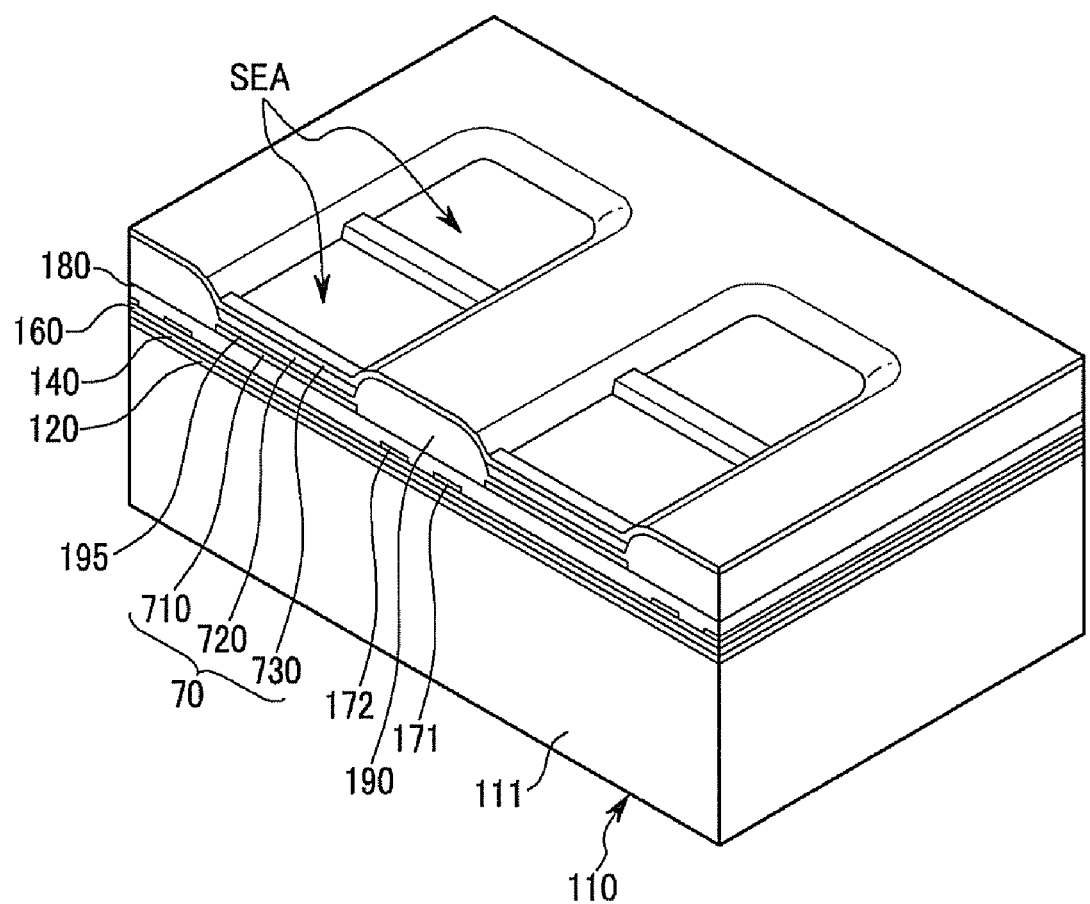
FIG. 3 is a partial cut-away perspective view of the organic light emitting diode display taken along line III-III of FIG. 1.

As shown in FIGS. 1 to 3, the organic light emitting diode (OLED) display 100 includes a display substrate 110 and a sealing member 210. FIG. 1 is a layout view showing the structure of a pixel on the display substrate 110. FIG. 2 is a cross-sectional view showing the display substrate 110 and the sealing member 210 taken along line II-II of FIG. 1. FIG. 3 is a cut-away perspective view of the display substrate 110 taken along line III-III of FIG. 1.

The display substrate 110 includes switching thin film transistors 10, driving thin film transistors 20, capacitors 80, and organic light emitting diodes 70 that are formed for each of pixels on a first substrate member 111. Further, the display substrate 110 includes gate lines 151 arranged in one direction, data lines 171 insulated from and crossing the gate lines 151, and a common power line 172. Here, one pixel may be defined by the gate lines 151, the data lines 171, and the common power line 172, but is not limited thereto.

The organic light emitting diode 70 includes a pixel electrode 710, an organic light emitting layer 720 formed on the pixel electrode 710, and a common electrode 730 formed on the organic light emitting layer 720. Here, the pixel electrode 710 is a positive (+) electrode which is a hole injection electrode, and the common electrode 730 is a negative (−) electrode which is an electron injection electrode. However, the aspects of the present invention are not necessarily limited thereto, and the pixel electrode 710 may be a negative electrode and the common electrode 730 may be a positive electrode according to a driving method of the organic light emitting diode display 100. Holes and electrons are injected from the pixel electrode 710 and the common electrode 730, respectively, to the organic light emitting layer 720. Light is emitted when excitons formed by combining the injected holes and electrons fall from an excited state to a ground state.

In addition, the organic light emitting diode display 100 according to the first exemplary embodiment of the present invention displays an image as the organic light emitting diode 70 emits light from the organic light emitting layer 720 in an opposite direction to the direction of the pixel electrode 710, i.e., in a direction of the common electrode 730. That is to say, the organic light emitting diode display 100 is formed as a front emission type.

The capacitor element 80 includes a first capacitor plate 158 and a second capacitor plate 178 that are arranged with a gate insulating film 140 interposed therebetween. Here, the gate insulating film 140 is a dielectric material. Capacitance is determined by charges accumulated in the capacitor element 80 and the voltage between the capacitor plates 158 and 178.

The switching thin film transistor 10 includes a switching semiconductor layer 131, a switching gate electrode 152, a switching source electrode 173, and a switching drain electrode 174, and the driving thin film transistor 20 includes a driving semiconductor layer 132, a driving gate electrode 155, a driving source electrode 176, and a driving drain electrode 177.

The switching thin film transistor 10 is used as a switching element to select a pixel to emit light. The switching gate electrode 152 is connected to the gate lines 151. The switching source electrode 173 is connected to the data lines 171. The switching drain electrode 174 is spaced apart from the switching source electrode 173 and connected to the first capacitor plate 158.

The driving thin film transistor 20 applies a driving power to the pixel electrode 310 to cause light emission from the organic light emitting layer 720 of the organic light emitting diode 70 in a selected pixel. The driving gate electrode 155 is connected to the first capacitor plate 158. The driving source electrode 176 and the second capacitor plate 178 are respectively connected to the common power line 172. The driving drain electrode 177 is connected to the pixel electrode 710 of the organic light emitting diode 70 through a contact hole 182.

With the above-described configuration, the switching thin film transistor 10 is driven by a gate voltage supplied to the gate lines 151 and supplies the gate voltage supplied to the gate lines 151 to the driving thin film transistor 20. A voltage corresponding to the difference between the common voltage supplied from the common power line 172 to the driving thin film transistor 20 and the data voltage supplied from the switching thin film transistor 10 is stored in the capacitor element 80. A current corresponding to the voltage stored in the capacitor element 80 flows into the organic light emitting diode 70 through the driving thin film transistor 20 to cause the organic light emitting diode 70 to emit light.

Further, the organic light emitting diode 70 is divided into an emitting area EA and a non-emitting area NEA. The emitting area EA is an area where the organic light emitting layer 720 emits light between the pixel electrode 710 and the common electrode 730, and the non-emitting area NEA is an area where the organic light emitting layer 720 does not emit light in the periphery of the emitting area EA.

Further, the organic light emitting diode display 100 includes a pixel defining film 190 and a light absorbing layer pattern 195.

The pixel defining film 190 has an opening 199 through which the pixel electrode 710 is exposed, and defines the emitting area EA and the non-emitting area NEA of the organic light emitting diode 70. At this time, the pixel electrode 710, the organic light emitting layer 720, and the common electrode 730 are sequentially arranged within the opening 199 of the pixel defining film 190, thereby causing the organic light emitting layer 720 to emit light. That is, a portion where the pixel defining film 190 is formed is substantially a non-emitting area NEA, and the opening 199 of the pixel defining film 190 is substantially an emitting area EA.

The light absorbing layer pattern 195 divides the opening 199 into a plurality of sub-emitting areas SEA within the opening 199 of the pixel defining film 190. The organic emission layer 720 may emit light on the plurality of sub-emitting areas SEA divided by the light absorbing layer pattern 195. Concretely, since the light absorbing layer pattern 195 is disposed between the pixel electrode 710 and the organic light emitting layer 720, the organic light emitting layer 720 does not substantially emit light on the light absorbing layer pattern 195.

The light absorbing layer pattern 195 is formed horizontally in a longitudinal direction of the opening 199 of the pixel defining film 190. Further, the light absorbing layer pattern 195 has a width d1 of $1/100$ to $1/20$ with respect to the length of the opening 199 of the pixel defining film 190. If the width d1 of the light absorbing layer pattern 195 is thicker than $1/20$ with respect to the length of the opening 199 of the pixel defining film 190, external light reflection is effectively suppressed, but the emitting area EA of the organic light emitting diode 70 is excessively reduced, thereby deteriorating the light emission efficiency of the organic light emitting diode display 100. On the contrary, if the width d1 of the light absorbing layer pattern 195 is thinner than $1/100$ with respect to the length of the opening 199 of the pixel defining film 190, it is difficult to effectively suppress external light reflection. In other words, improvement in the contrast and visibility of the organic light emitting diode display 100 becomes insignificant.

In addition, two or more light absorbing layer patterns 195 are formed for one opening 199 of the pixel defining film 190. That is, three or more sub-emitting areas SEA are formed per pixel. FIG. 1 illustrates a case where the light absorbing layer pattern 195 divides one opening 199 of the pixel defining film 190 into four sub-emitting areas SEA, but the first exemplary embodiment of the present invention is not limited thereto.

The light absorbing layer pattern 195 is prepared on the same layer through the same process by using the same material as the pixel defining film 190. Further, the light absorbing layer pattern 195 and the pixel defining film 190 have a black base color. The light absorbing layer pattern 195 and the pixel defining film 190 may be prepared by adding a black-based pigment to resins, such as polyacrylate resin and polyimide resin, or silica-based inorganic materials.

The light absorbing layer pattern 195 and the pixel defining film 190 may be formed through a well-known photolithography process or photo-etching process. The photolithography process may include a half-tone exposure process using a mask. Further, the light absorbing layer pattern 195 and the pixel defining film 190 may be formed in various well-known methods.

The sealing member 210 is disposed facing the display substrate 110, and covers the thin film transistors 10 and 20, the capacitor element 80, the organic light emitting diode 70, etc., so as to be sealed from the outside. The sealing member 210 includes a second substrate member 211. Although not shown, the display substrate 110 and the sealing member 210 are bonded and sealed together through a sealant disposed along the edges of the display substrate 110 and the sealing member 210.

With the above-described configuration, the organic light emitting diode display 100 is able to effectively suppress deterioration of visibility and contrast due to external light reflection. In addition, the loss of light generated from the organic light emitting diode 70 can be minimized. That is, the organic light emitting diode display 100 may omit components, such as a polarizing member generally used to suppress external light reflection, due to the light absorbing layer pattern 195. Therefore, the light emission efficiency of the organic light emitting diode display 100, which is relatively low when using a polarizing member, can be improved. In other words, the luminance and life span of the organic light emitting diode display 100 can be improved.

Hereinafter, the structure of the organic light emitting diode display 100 according to the first exemplary embodiment of the present invention will be described concretely according to lamination order. Further, hereinafter, the structure of the thin film transistors will be described with a focus laid on the driving thin film transistors 20. Additionally, the switching thin film transistor 10 will be described briefly with respect to the difference with the driving thin film transistor.

First, the display substrate 110 will be described. The first substrate member 111 is formed of an insulating substrate made of glass, quartz, ceramic, plastic, etc. However, the aspects of the present invention are not limited thereto. Therefore, the first substrate member 111 may be formed of a metal substrate made of stainless steel or the like.

A buffer layer 120 is formed on the first substrate member 111. The buffer layer 120 plays the role of preventing penetration of impurity elements and planarizes the surface, and may be formed of various materials that are capable of playing this role. For example, as the buffer layer 120, any one of a silicon nitride (SiNx) film, a silicon oxide (SiNx) film, and a silicon oxynitride (SiOxNy) film may be used. However, the buffer layer 120 is not necessarily required, and may be omitted according to the type of the first substrate member 111 and the process conditions.

A driving semiconductor layer 132 is formed on the buffer layer 120. The driving semiconductor layer 132 is formed of a polysilicon film. Further, the driving semiconductor layer 132 includes a channel region 135, and a source area 136 and a drain area 137 that are formed by p+ doping at both sides of the channel area 135. At this time, an ion material to be doped is a P-type impurity, such as boron (B), and $B_2H_6$ is used as the ion material. Here, such an impurity differs according to the type of thin film transistors.

In the first exemplary embodiment of the present invention, a thin film transistor of a PMOS structure using a P-type impurity as the driving thin film transistor 20 is used, but is not limited thereto. Accordingly, thin film transistors of both NMOS and CMOS structures may be used as the driving thin film transistor 20.

Further, while the driving thin film transistor 20 shown in FIG. 2 is a polycrystalline thin film transistor including a polysilicon film, the switching thin film transistor 10 not shown in FIG. 2 may be a polycrystalline thin film transistor or an amorphous thin film transistor including an amorphous silicon film.

A gate insulating film 140 formed of silicon nitride SiNx or silicon oxide SiOx is formed on the driving semiconductor layer 132. Gate wires including a driving gate electrode 155 are formed on the gate insulating film 140. Further, the gate wires further include gate lines 151, the first capacitor plate 158, and other wires. In addition, the driving gate electrode 155 is formed so as to overlap with at least some of the driving semiconductor layer 132, particularly at the channel region.

An interlayer insulating film 160 covering the driving gate electrode 155 is formed on the gate insulating film 140. The gate insulating layer 140 and the interlayer insulating layer 160 have through holes through which the source area 136 and drain area 137 of the driving semiconductor layer 132 are exposed. Like the gate insulating film 140, the interlayer insulating layer 160 is formed of silicon nitride (SiNx) or silicon oxide (SiOx).

Data wires including a driving source electrode 176 and a driving drain electrode 177 are formed on the interlayer insulating film 160. The data wires further include data lines 171, a common power line 172, a second capacitor plate 178, and other wires. In addition, the driving source electrode 176 and the driving drain electrode 177 are connected to the source area 136 and drain area 137 of the driving semiconductor layer 132 through the through holes formed on the interlayer insulating film 160 and the gate insulating film 140, respectively.

In this manner, the driving thin film transistor 20 including the driving semiconductor layer 132, the driving gate electrode 155, the driving source electrode 176, and the driving drain electrode 177 is formed. The configuration of the driving thin film transistor 20 is not limited to the foregoing example, but can be changed into a variety of well-known configurations that can be easily produced by those skilled in the art.

A planarization film 180 covering the data wires 172, 176, 177, and 178 is formed on the interlayer insulating film 160. The planarization film 180 serves to eliminate and planarize a stepped region in order to increase the light emission efficiency of the organic light emitting diode 70 to be formed thereon. Further, the planarization film 180 has a contact hole 182 for exposing a part of the drain electrode 177.

The planarization film 180 may be made of one or more of polyacrylate resin, epoxy resin, phenolic resin, polyamide resin, polyimide resin, unsaturated polyester resin, poly(phenylene ether) resin, poly(phenylenesulfide) resin, and benzocyclobutene (BCB).

Further, the first exemplary embodiment of the present invention is not limited to the above-described structure, and any one of the planarization film 180 and the interlayer insulating film 160 may be omitted in some cases.

A pixel electrode 710 of the organic light emitting diode 70 is formed over the planarization film 180. That is, the organic light emitting diode display 100 includes a plurality of pixel electrodes 710 arranged for each of a plurality of pixels. The plurality of pixel electrodes 710 are spaced apart from each other. The pixel electrode 710 is connected to the drain electrode 177 through the contact hole 182 of the planarization film 180.

In addition, a pixel defining film 190 having an opening 199 for exposing the pixel electrode 710 and a light absorbing layer pattern 195 for dividing the opening 199 of the pixel defining film 190 into a plurality of sub-emitting areas are formed over the planarization film 180.

The pixel defining film 190 has a plurality of openings 199 formed for each pixel. In addition, the pixel electrode 710 is disposed so as to correspond to the opening 199 of the pixel defining film 190. However, the pixel electrode 710 is not always disposed in the opening 199 of the pixel defining film 190, but may be disposed under the pixel defining film 190 so that a portion of the pixel electrode 710 overlaps with the pixel defining film 190. A portion where the pixel defining film 190 is formed is a non-emitting area NEA, and a portion where the opening 199 of the pixel defining film 190 is formed is an emitting area EA.

The light absorbing layer pattern 195 divides the opening 199 of the pixel defining film 190 into a plurality of sub-emitting areas SEA. The light absorbing layer pattern 195 is formed horizontally in a longitudinal direction of the opening 199 of the pixel defining film 190. Further, two or more light absorbing layer patterns 195 are formed per opening 199 of the pixel definition film 190. That is, three or more sub-emitting areas SEA are formed per pixel.

The light absorbing layer pattern 195 is prepared on the same layer through the same process by using the same material as the pixel defining film 190. Further, the light absorbing layer pattern 195 and the pixel defining film 190 have a black base color. The light absorbing layer pattern 195 and the pixel defining film 190 may be prepared by adding a black-based pigment to resins, such as polyacrylate resin and polyimide resin, or silica-based inorganic materials.

An organic light emitting layer 720 is formed on the pixel electrode 710, and a common electrode 730 is formed on the organic light emitting layer 720. In this manner, an organic light emitting diode 70 including the pixel electrode 710, the organic light emitting layer 720, and the common electrode 730 is formed. The organic emission layer 720 may emit light on the plurality of sub-emitting areas SEA divided by the light absorbing layer pattern 195. That is, the organic light emitting layer 720 is disposed between the pixel electrode 710 and the common electrode 730 on the plurality of sub-emitting areas SEA, thus producing light.

The organic light emitting layer 720 is made of a low molecular organic material or a polymer material. The organic light emitting layer 720 may be formed as multiple layers including a light emitting layer and one or more of a hole-injection layer (HIL), a hole-transporting layer (HTL), an electron-transporting layer (ETL), and an electron-injection layer (EIL). If all these are included, the hole-injection layer is disposed on the pixel electrode 710 which is a positive electrode, and the hole-transporting layer, the light emitting layer, the electron-transporting layer, and the electron-injection layer are sequentially stacked on the hole-injection layer.

Further, although FIG. 2 illustrates a case where the organic light emitting layer 720 is disposed only in the opening 199 of the pixel defining film 190, the first exemplary embodiment of the present invention is not limited thereto. Therefore, the organic light emitting layer 720 may be disposed between the pixel defining film 190 and the common electrode 730, as well as being formed over the pixel electrode 710 in the opening 199 of the pixel defining film 190. Concretely, among various films, such as the hole-injection layer HIL, the hole-transporting layer HTL, the electron-transporting layer ETL, the electron-injection layer EIL, and so on that are included, along with the light emitting layer in the organic light emitting layer 720, the hole-injection layer HIL, the hole-transporting layer HTL, the electron-transporting layer ETL, and the electron-injection layer EIL, may be formed over the pixel defining film 190 as well as over the pixel electrode 710, by using an open mask in the manufacturing process, like the common electrode 730. That is, one or more of various films of the organic light emitting layer 720 may be disposed between the pixel defining film 190 and the common electrode 730.

The pixel electrode 710 and the common electrode 730 may be respectively formed of a transparent conductive material or a semi-transmissive or reflective conductive material. The organic light emitting diode display 100 may be a front emission type, a rear emission type, or a both-direction emission type according to the type of material forming the pixel electrode 710 and the common electrode 730.

Meanwhile, the organic light emitting diode display 100 according to the first exemplary embodiment of the present invention is formed as a front emission type. That is, the organic light emitting diode 70 displays an image by emitting light in the direction of the sealing member 210.

As the transparent conductive material, indium tin oxide (ITO), indium zinc oxide (IZO), zinc oxide (ZnO), or indium oxide ($In_2O_3$) can be used. As the reflective or semi-transmissive material, lithium (Li), calcium (Ca), lithium fluoride/calcium (LiF/Ca), lithium fluoride/aluminum (LiF/Al), aluminum (Al), silver (Ag), magnesium (Mg), or gold (Au) can be used.

The sealing member 210 is disposed on the common electrode 730. The second substrate member 211 of the sealing member 210 is formed of a transparent material, such as glass and plastic.

Though not shown, a sealant is disposed along the edges of the display substrate 110 and the sealing member 210, and bonds and seals the display substrate 110 and the sealing member 210 together.

With the above-described configuration, the organic light emitting diode display 100 can have improved visibility. That is, through the light absorbing layer pattern 195, the organic light emitting diode display 100 can suppress deterioration of visibility and contrast due to external light reflection. In addition, the luminance and life span of the organic light emitting diode display 100 are improved by enhancing light emission efficiency.

Hereinafter, a second exemplary embodiment of the present invention will be described with reference to FIGS. 4 and 5.

Figure 4:
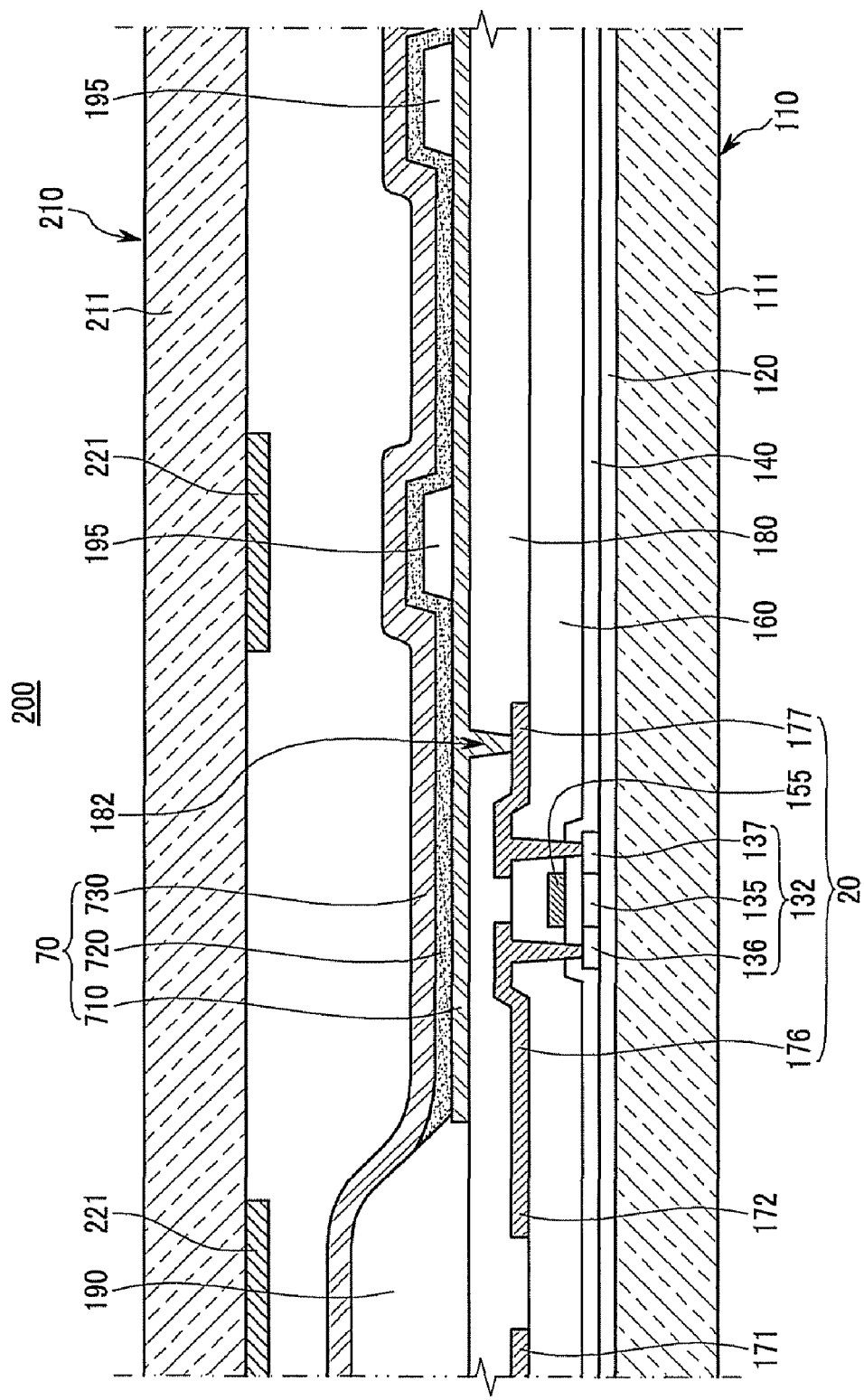
FIG. 4 is a cross-sectional view of the organic light emitting diode display according to a second exemplary embodiment of the present invention.

As shown in FIG. 4, an organic light emitting diode display 200 according to the second exemplary embodiment of the present invention further includes a light shielding film pattern 221 formed on one surface of the second substrate member 211 facing the display substrate 110. That is, the sealing member 210 includes the second substrate member 211 and the light shielding film pattern 221 formed on one surface of the second substrate member 211 facing the display substrate 110. Although FIG. 4 illustrates a case where the light shielding film pattern 221 is formed on one surface of the second substrate member 211 facing the display substrate 110, the second exemplary embodiment according to the present invention is not limited thereto. Therefore, the light shielding film pattern 221 may be formed on a surface of the second substrate member 211 opposed to the surface facing the display substrate 110.

Figure 5:
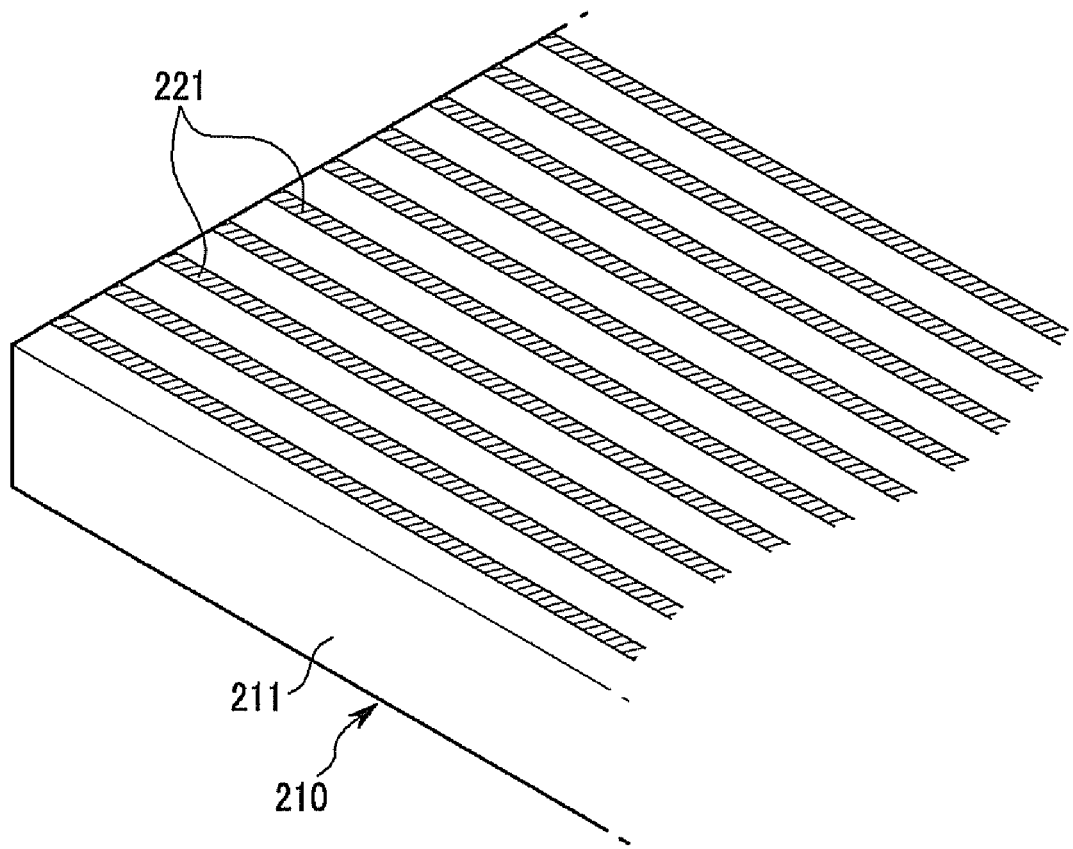
FIG. 5 is a partial perspective view of a second substrate on which a light shielding film pattern of FIG. 4 is formed.

As shown in FIG. 5, the light shielding film pattern 221 is formed in a stripe pattern. The light shielding film pattern 221 partly blocks the light reflected on the common electrode 730 formed on the light absorbing layer pattern 195 or the pixel defining film 190, or the light reflected on the pixel electrode 710 in the sub-emitting areas SEA. Therefore, the organic light emitting diode display 100 according to an aspect of the present invention can have improved visibility and contrast.

In addition, the light shielding film pattern 221 has a width of about several micrometers (μm), and preferably the light shielding film pattern 221 has a width of about 1 to 9 micrometers (μm). If the width of the light shielding film pattern 221 is less than about several micrometers, the effect of suppressing external light reflection is reduced. On the other hand, if the width of the light shielding film pattern 221 is greater than about several tens of micrometers, the light emission efficiency of the organic light emitting diode display 100 deteriorates.

Further, the light shielding film pattern 221 may be made of one or more of metal materials, inorganic materials, and organic materials. Concretely, the light shielding film pattern 221 is formed of a same material as the second substrate member 211, or is formed of an appropriate material according to a method of bonding the display substrate 110 and the sealing member 210 together. For example, if the second substrate member 211 is made of a glass material, or a sealant (not shown) for bonding the display substrate 110 and the sealing member 210 together is made of a glass-based material such as a frit glass, it is advantageous that the light shielding film pattern 221 is formed of a metal material or black inorganic material that is capable of resisting a high firing temperature. Here, the metal material may include titanium oxide (TiO$_2$), iron oxide (FeO$_2$), chromium (Cr), silver (Ag), and so on. Further, the black inorganic material may include a variety of well known organic films. On the other hand, if the sealant (not shown) is made of an organic material or the second substrate 211 is made of an organic thin film, the light absorbing layer pattern 195 may be formed of an organic material containing fine black particles. Here, the fine black particles may include carbon black or tin and tin alloys having an average diameter of 1 to 300 nm.

The light shielding pattern 221 may be formed through a photo-etching process. A concrete method for forming the light shielding film pattern 221 through a photo-etching process will be described below. First, a light shielding film is applied on the second substrate member 211, and then a photosensitive film pattern is formed thereon by a photolithography process using a mask. Then, the light shielding film is etched by an etching process using a photosensitive film pattern to form a light shielding film pattern 221.

Further, the light shielding film pattern 221 may be formed by an inkjet printing method, as well as by the photo-etching process.

With the above-described configuration, the organic light emitting diode display 200 may have more improved visibility. That is, the organic light emitting diode display 200 is able to more effectively suppress deterioration of visibility due to external light reflection and improve contrast using the light absorbing layer pattern 195 of the display substrate 110 and the light shielding film pattern 221 of the sealing member 210. In addition, since the light emission efficiency of the organic light emitting diode display 200 can be enhanced, the luminance and life span of the organic light emitting diode display 100 can be improved.

Figure 6:
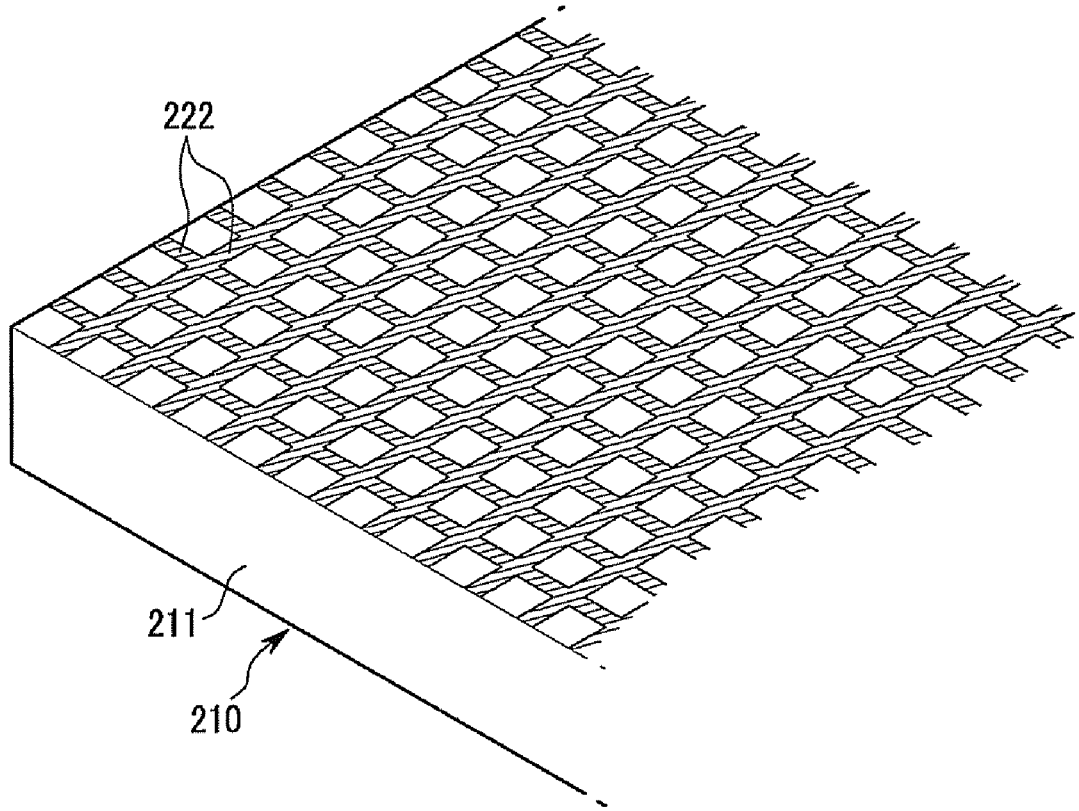
FIG. 6 is a partial perspective view of a second substrate on which a light shielding film pattern according to a modified example of the second exemplary embodiment of the present invention is formed.

FIG. 6 shows a light shielding film pattern 222 of the sealing member 210 according to a modified example of the second embodiment of the present invention. As shown in FIG. 6, in the modified example of the second exemplary embodiment of the present invention, the light shielding film pattern 222 of the sealing member 210 is formed in a lattice pattern. In this manner, the light shielding film pattern 222 formed in the lattice pattern can also effectively suppress external light reflection.

Hereinafter, a third exemplary embodiment of the present invention will be described with reference to FIGS. 7 and 8.

Figure 7:
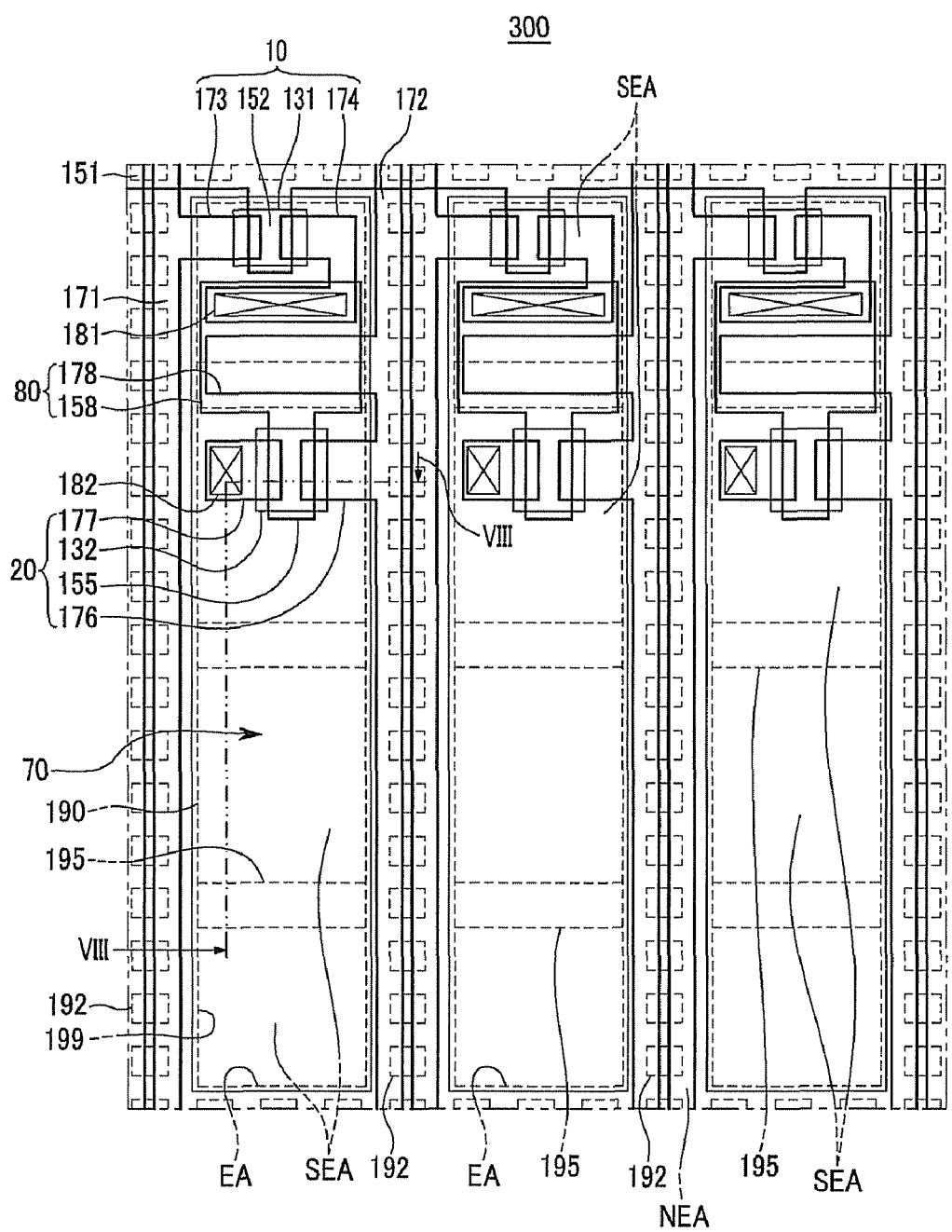
FIG. 7 is a layout view of an organic light emitting diode display according to a third exemplary embodiment of the present invention.
Figure 8:
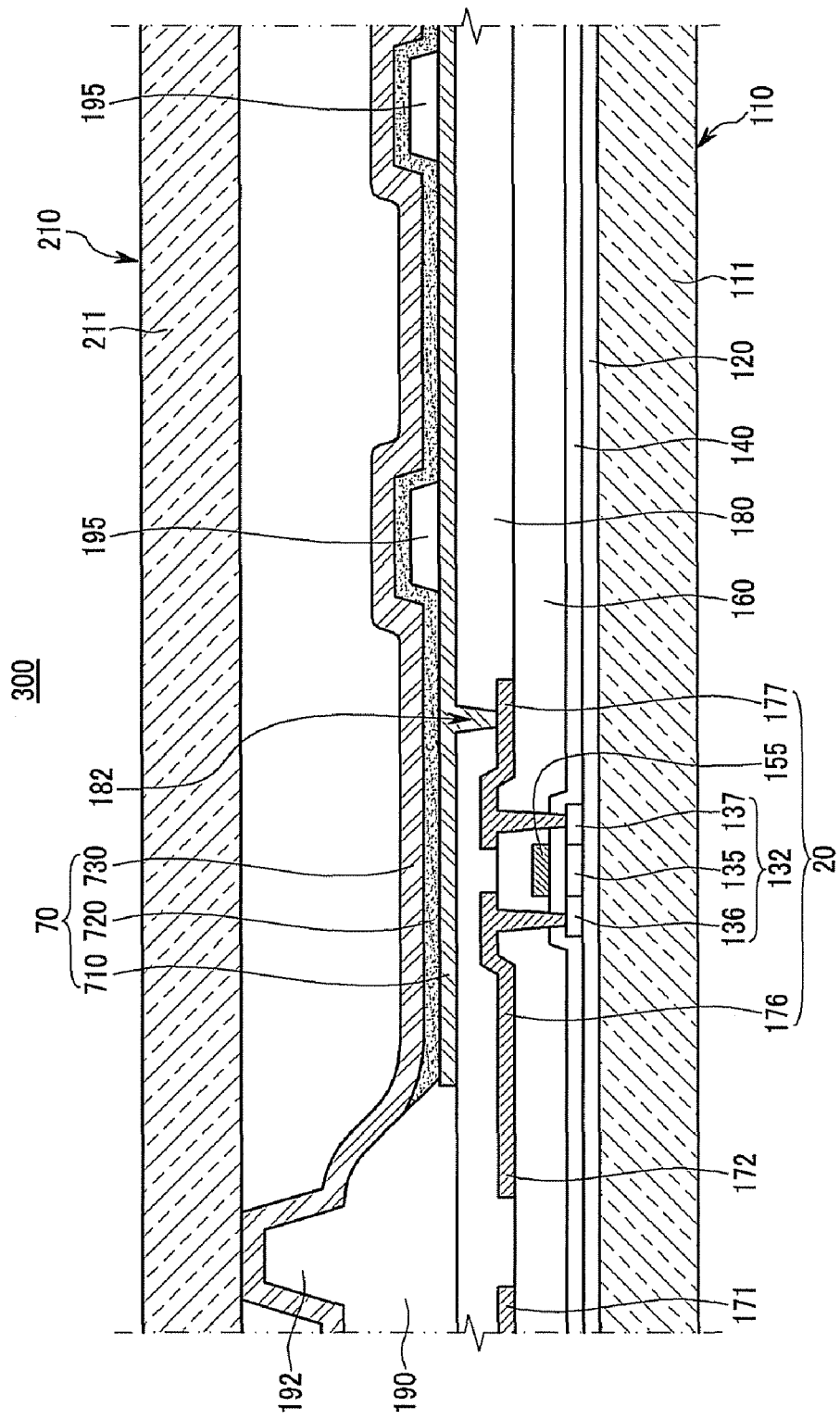
FIG. 8 is a cross-sectional view taken along line VIII-VIII of FIG. 7.

As shown in FIGS. 7 and 8, the organic light emitting diode display 300 according to the third exemplary embodiment of the present invention further includes a plurality of light scattering spacers 192 protruding on the pixel defining film 190.

The light scattering spacers 192 serve to maintain the gap between the display substrate 110 and the sealing member 210. Also, the light scattering spacers 192 serve to scatter external light reflected on conductive films disposed under the light scattering spacers 192 so as to suppress external light reflection. Here, the conductive films may be gate lines 151, data lines 171, a common power line 172, and the like. Therefore, the organic light emitting diode display 300 is able to suppress external light reflection more effectively through the light absorbing layer pattern 195 and the light scattering spacers 192.

The pixel defining film 190, light absorbing layer pattern 195, and light scattering spacers 192 may be integrally formed of a photosensitive material through a photolithography process. That is, the pixel defining film 190, light absorbing layer pattern 195, and light scattering spacers 192 may be formed together by adjusting an exposure amount through a half-tone exposure process. However, the third exemplary embodiment according to the present invention is not limited thereto. Therefore, the pixel defining film 190 and the light scattering spacers 192 may be sequentially or independently formed, and may be made of different materials from each other.

With the above-described configuration, the organic light emitting diode display 300 may have more improved visibility. That is, the organic light emitting diode display 300 is able to more effectively suppress deterioration of visibility due to external light reflection and improve contrast through the light absorbing layer pattern 195 and light scattering spacers 192 of the display substrate 110. In addition, since the light emission efficiency of the organic light emitting diode display 300 can be enhanced, the luminance and life span of the organic light emitting diode display 100 can be improved.

Hereinafter, a fourth exemplary embodiment of the present invention will be described with reference to FIG. 9.

Figure 9:
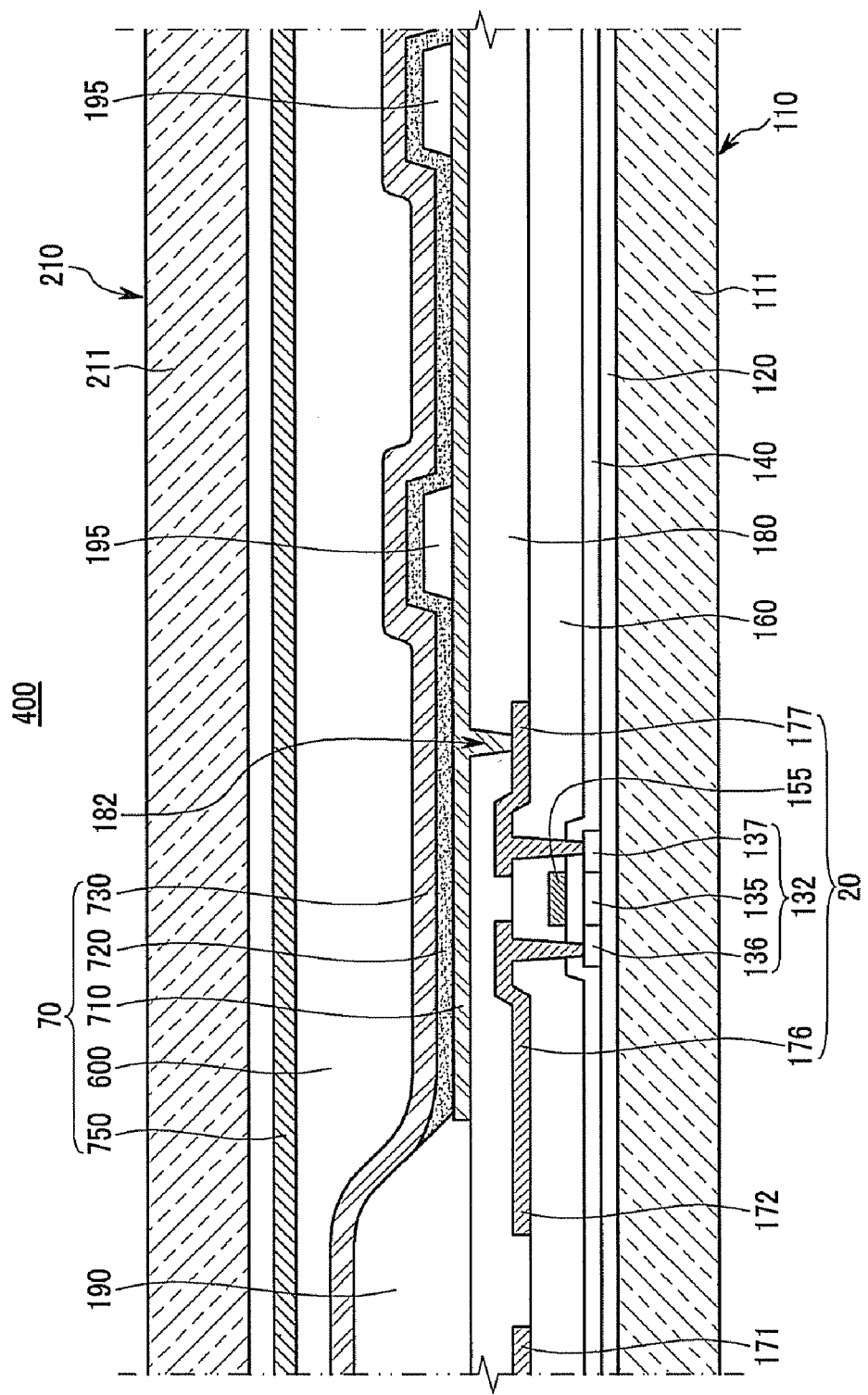
FIG. 9 is a cross-sectional view of an organic light emitting diode display according to a fourth exemplary embodiment of the present invention.

As shown in FIG. 9, the organic light emitting diode 70 of an organic light emitting diode display 400 according to the fourth exemplary embodiment of the present invention further includes a transmissive film 600 formed on the common electrode 730 and an additional common electrode 750 formed on the transmissive film 600. Hereinafter, the common electrode 730 is referred to as a first common electrode, and the additional common electrode 750 is referred to as a second common electrode. Here, the first common electrode 730 is formed on the organic light emitting layer 720 and the pixel defining film 190. The transmissive film 600 is formed on the first common electrode 730, and the second common electrode 750 is formed on the transmissive film 600.

The first common electrode 730 and the second common electrode 750 are formed of a semi-transmissive film. The semi-transmissive film used as the first common electrode 730 and the second common electrode 750 is formed of one or more metals among magnesium (Mg), silver (Ag), calcium (Ca), lithium (Li), chromium (Cr), and aluminum (Al).

Further, the first common electrode 730 and the second common electrode 750 have appropriate reflectance in order to effectively emit light generated from the organic light emitting diode 70 and minimize the external reflective light. For example, the first common electrode 730 may have reflectance of 50% or less, and the second common electrode 750 may have reflectance of 30% or less.

The transmissive film 600 is tightly attached at both surfaces to the first common electrode 730 and the second common electrode 750, respectively. That is, no interface with air exists between the transmissive film 600 and the first common electrode 730 and second common electrode 750. Therefore, a considerable amount of the external light is eliminated due to destructive interference caused by reflection between the first common electrode 730 and the second common electrode 750. Furthermore, in order to cause destructive interference of light between the first common electrode 730 and the second common electrode 750, the transmissive film 600 has an appropriate refractive index and thickness.

The thickness and refractive index of the transmissive film 600 can be established by the following formula derived from the condition of destructive interference of reflected light.

$$d = \lambda/4Nd \cos\theta \quad \text{Formula I}$$

wherein d is the distance between two reflecting surfaces. That is, d equals the spacing distance between the first common electrode 730 and the second common electrode 750 and the thickness of the transmissive film 600. N is the refractive index of the transmissive film 600, and $\theta$ is an incident angle of light. $\lambda$ is the wavelength of reflected light.

The wavelength of visible light and the refractive index of a material used for the transmissive film 600 are substituted into the formula. When it is assumed that the average incident angle of external light is approximately 30 to 45 degrees, the average thickness of the transmissive film 600 can be calculated. That is, the transmissive film 600 is set to have an appropriate thickness according to the type of material used for the transmissive film 600. On the other hand, the transmissive film 600 may be formed of a material having an appropriate refractive index in order to form the transmissive film 600 at a desired thickness.

With the above-described structure, the light directed toward the first common electrode 730 via the second common electrode 750 from the outside is partly reflected on the first common electrode 730 and directed again toward the second common electrode 750. A part of the light directed toward the second common electrode 750 is emitted to the outside through the second common electrode 730, and the other part thereof is reflected again and directed toward the first common electrode 730. In this manner, as the light entering from the outside is repeatedly reflected between the first common electrode 730 and the second common electrode 750, with the transmissive film 600 interposed therebetween, destructive interference occurs and a considerable amount of the light is eliminated. Therefore, the organic light emitting diode display 400 is able to improve visibility by suppressing external light reflection.

With the above-described configuration, the organic light emitting diode display 400 may have more improved visibility. That is, the organic light emitting diode display 400 is able to more effectively suppress deterioration of visibility due to external light reflection and improve contrast through the light absorbing layer pattern 195 of the display substrate 110 and the first and second common electrodes of the organic light emitting diode. In addition, since the light emission efficiency of the organic light emitting diode display 400 can be enhanced, the luminance and life span thereof can be improved.

Hereinafter, a fifth exemplary embodiment of the present invention will be described with reference to FIG. 10.

Figure 10:
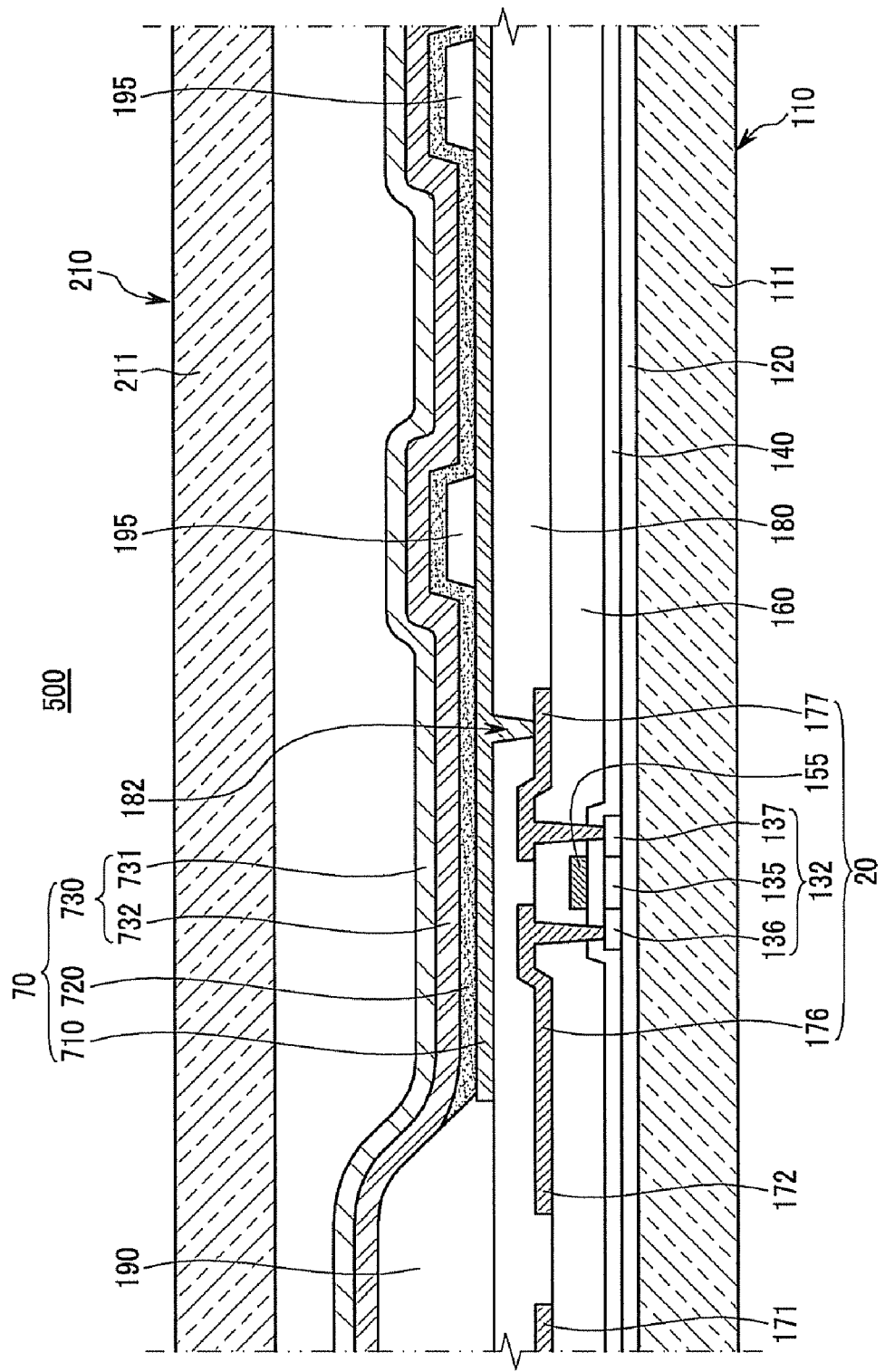
FIG. 10 is a cross-sectional view of an organic light emitting diode display according to a fifth exemplary embodiment of the present invention.

As shown in FIG. 10, a common electrode 730 of the organic light emitting diode 70 of the organic light emitting diode display 500 according to the fifth exemplary embodiment of the present invention is formed of a double film. The common electrode 730 includes a first metal film 731 and a second metal film 732. Here, the first metal film 731 includes silver (Ag), and the second metal film 732 includes any one metal among a magnesium-silver alloy (Mg:Ag), aluminum (Al), calcium (Ca), lithium (Li), and chromium (Cr).

In this manner, if the common electrode 730 is formed of a double film, surface resistance and reflectance are reduced. That is, the organic light emitting diode display 500 can improve power utilization efficiency because it suppresses external light reflection and provides good electrical conductivity.

Hereinafter, referring to FIG. 11, external light reflection efficiency according to the width of the light absorbing layer pattern 195 relative to the length of the opening 199 of the pixel defining film 190 and transmission efficiency of light emitted from the organic light emitting diode 70 in the organic light emitting diode display 100 according to the first exemplary embodiment of the present invention will be discussed.

Figure 11:
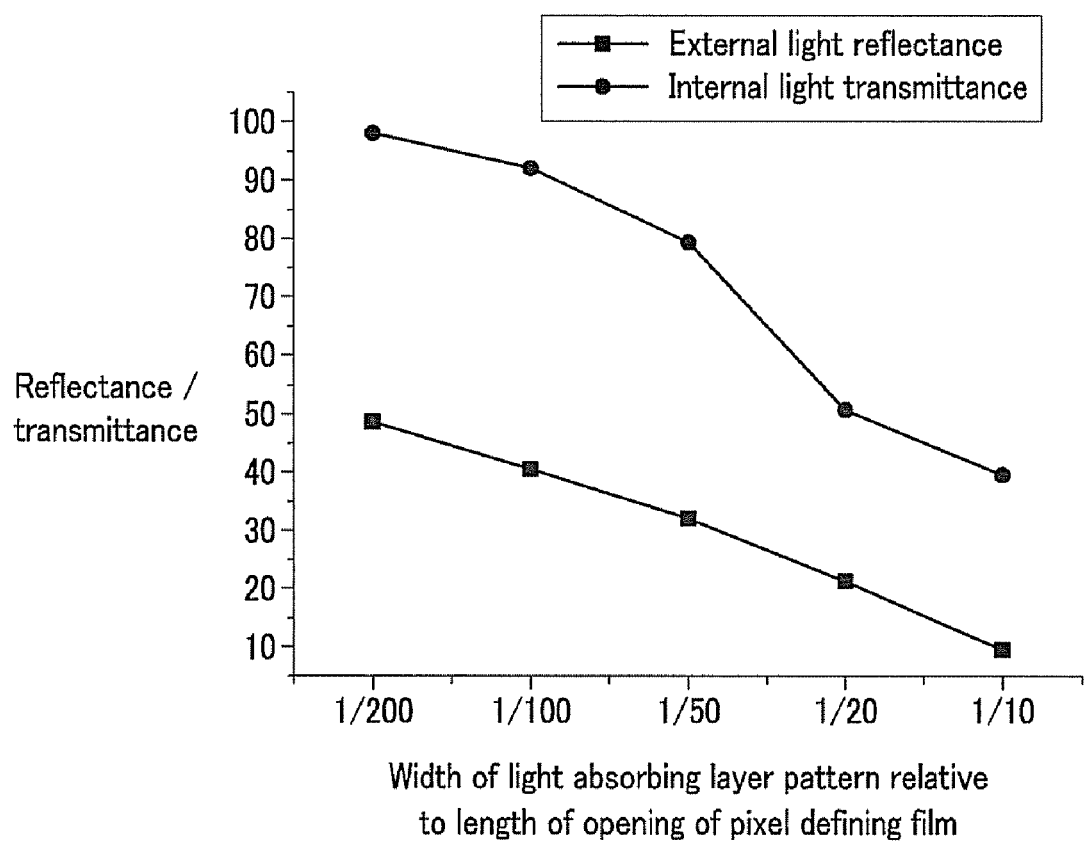
FIG. 11 is a graph showing external light reflectance and internal light transmittance according to the width of a light absorbing layer pattern relative to the length of an opening of a pixel defining film.

FIG. 11 is a graph showing changes in external light reflectance and internal light transmittance according to the width of the light absorbing layer pattern 195 when five light absorbing layer patterns 195 are formed for one opening 199 of the pixel defining film 190. Here, internal light transmittance refers to the transmittance of light emitted from the organic light emitting diode 70.

As shown in FIG. 11, the greater the width of the light absorbing layer pattern 195 relative to the length of the opening 199 of the pixel defining film 190, the lower the external light reflectance and the internal light transmittance.

Considering appropriate suppression of external light reflection and transmittance of light emitted from the organic light emitting diode 70, the width of the light absorbing layer pattern 195 relative to the length of the opening 199 of the pixel defining film 190 is preferably $1/100$ to $1/20$. In other words, it is preferable that the width of the light absorbing layer pattern 195 is adjusted within a range in which the external light reflectance is maintained to be approximately less than 0.45 and the internal light transmittance is maintained to be more than 0.55.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
    a substrate;
    a pixel electrode formed on the substrate;
    a pixel defining film having an opening that defines a light emitting area of a single pixel, the pixel electrode being exposed through the opening, and formed on the substrate;
    a light absorbing layer pattern for dividing the opening into a plurality of sub-emitting areas within the opening of the pixel defining film;
    an organic light emitting layer formed on the pixel electrode; and
    a common electrode formed on the organic light emitting layer.

2. The organic light emitting diode display of claim 1, wherein the light absorbing layer pattern is formed between the pixel electrode and the organic light emitting layer.

3. The organic light emitting diode display of claim 2, wherein the organic light emitting layer generates light at the plurality of sub-emitting areas divided by the light absorbing layer pattern.

4. The organic light emitting diode display of claim 1, wherein the light absorbing layer pattern is formed horizontally in a longitudinal direction of the opening of the pixel defining film.

5. The organic light emitting diode display of claim 4, wherein the light absorbing layer pattern has a width of $1/100$ to $1/20$ with respect to a length of the opening of the pixel defining film.

6. The organic light emitting diode display of claim 5, wherein two or more light absorbing layer patterns are formed for one opening of the pixel defining film.

7. The organic light emitting diode display of claim 5, wherein the width of the light absorbing layer pattern is adjusted within a range in which external light reflectance is less than 0.45 and internal light transmittance is more than 0.55.

8. The organic light emitting diode display of claim 1, wherein the light absorbing layer pattern and the pixel defining film have a black base color.

9. The organic light emitting diode display of claim 8, wherein the light absorbing layer pattern is formed on a same layer as the pixel defining film through a same process.

10. The organic light emitting diode display of claim 1, wherein the organic light emitting diode display further comprises a sealing member that has a light shielding film pattern formed on a surface of the sealing member and facing the common electrode.

11. The organic light emitting diode display of claim 10, wherein the light shielding film pattern is formed in a stripe pattern parallel to the light absorbing layer pattern.

12. The organic light emitting diode display of claim 10, wherein the light shielding film pattern is formed in a lattice pattern.

13. The organic light emitting diode display of claim 10, wherein the light shielding film pattern has a width of about several micrometers (μm).

14. The organic light emitting diode display of claim 1, further comprising a transmissive film formed on the common electrode and an additional common electrode formed on the transmissive film.

15. The organic light emitting diode display of claim 14, wherein the common electrode and the additional common electrode are formed of a semi-transmissive film.

16. The organic light emitting diode display of claim 15, wherein the common electrode and the additional common electrode are made of one or more metals among magnesium (Mg), silver (Ag), calcium (Ca), lithium (Li), chromium (Cr), and aluminum (Al).

17. The organic light emitting diode display of claim 1, wherein the common electrode is formed of a double film including a first metal film and a second metal film, and the first metal film includes silver (Ag) and the second metal film includes any one metal among a magnesium-silver alloy (Mg:Ag), aluminum (Al), calcium (Ca), lithium (Li), and chromium (Cr).

18. The organic light emitting diode display of claim 1, further comprising a plurality of light scattering spacers protruding from the pixel defining film.

19. The organic light emitting diode display of claim 18, wherein a shape of the light scattering spacers includes one or more of a prismoid, a prism, a cone, a cylinder, a hemisphere, and a semi-spheroid.

20. The organic light emitting diode display of claim 19, further comprising a sealing member disposed on the substrate, wherein the light scattering spacers maintain a gap between the substrate and the sealing member.

21. The organic light emitting diode display of claim 20, wherein the light scattering spacers are integrally formed with the pixel defining film by the same process and using the same material.

22. An organic light emitting diode display, comprising:
   a substrate;
   an organic light emitting diode formed on the substrate, the organic light emitting diode including a pixel electrode, an organic light emitting layer and a common electrode;
   a pixel defining film formed in between portions of the substrate where the organic light emitting diode is formed and having an opening that defines a light emitting area of a single pixel and exposes the pixel electrode; and
   a light absorbing layer pattern formed in between the pixel electrode and the organic light emitting layer of the organic light emitting diode forming a plurality of sub-emitting areas.

23. The organic light emitting diode display of claim 22, wherein the organic light emitting diode display further comprises a sealing member formed on the common electrode, the sealing member having a light shielding film pattern formed on a surface of the sealing member facing the common electrode.

24. The organic light emitting diode display of claim 23, wherein the light shielding film pattern is formed in a stripe pattern parallel to the light absorbing layer pattern.

25. The organic light emitting diode display of claim 23, wherein the light shielding film pattern is formed in a lattice pattern.

26. The organic light emitting diode display of claim 22, further comprising a transmissive film formed on the common electrode and an additional common electrode formed on the transmissive film.

27. An organic light emitting diode display, comprising:
   a substrate;
   an organic light emitting diode formed on the substrate, the organic light emitting diode including a pixel electrode, an organic light emitting layer and a common electrode;
   a pixel defining film having an opening that defines a light emitting area of a single pixel and the organic light emitting diode being exposed through the opening; and
   a light absorbing layer pattern formed on the opening and forming a plurality of sub-emitting areas.

* * * * *